United States Patent [19]

Rinderle

[11] Patent Number: 4,845,445
[45] Date of Patent: Jul. 4, 1989

[54] AMPLIFIER

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 139,812

[22] Filed: Dec. 30, 1987

[30] Foreign Application Priority Data

Feb. 25, 1987 [DE] Fed. Rep. of Germany ....... 3705932

[51] Int. Cl.⁴ ............................................. H03F 3/191
[52] U.S. Cl. ..................................... 330/306; 330/305
[58] Field of Search ............... 330/302, 303, 304, 305, 330/306; 358/184

[56] References Cited

U.S. PATENT DOCUMENTS 3,700,796 10/1972 Griffey ................................. 358/184

FOREIGN PATENT DOCUMENTS 2649519 2/1979 Fed. Rep. of Germany .
0137042 8/1979 German Democratic Rep. ..................................... 330/306

Primary Examiner—Steven Mottola
Attorney, Agent, or Firm—Spencer & Frank

[57] ABSTRACT

In an amplifier comprising an amplifier transistor and a tunable selection circuit with a coil, a further coil is arranged between the collector of the amplifier transistor and the supply voltage source and is inductively coupled with the coil of the tunable selection circuit.

4 Claims, 1 Drawing Sheet

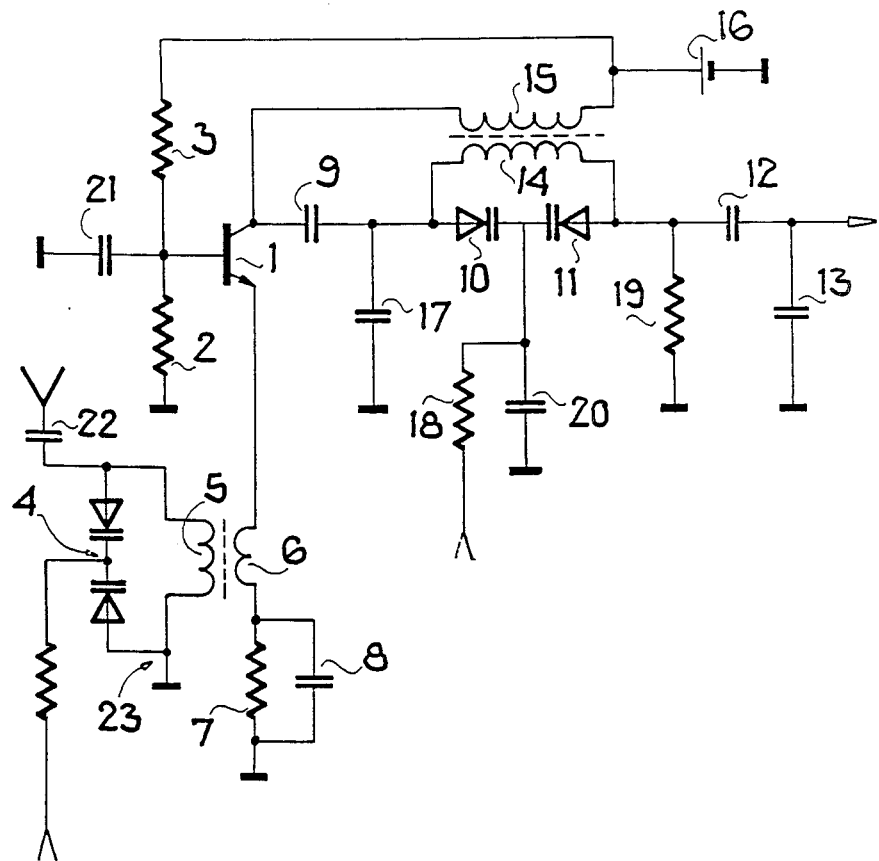

AMPLIFIER

BACKGROUND OF THE INVENTION

The invention relates to an amplifier which comprises an amplifier transistor and a tunable selection circuit with a coil, wherein the signal from the collector of the amplifier transistor is fed to the selection circuit via a capacitor. Such amplifiers are used, for example, in radio or television receivers.

SUMMARY OF THE INVENTION

The object underlying the invention is to indicate an amplifier which is as simple as possible in design and yet attains high image selection values. In accordance with the invention, in an amplifier comprising an amplifier transistor and a tunable selection circuit with a coil, a further coil is arranged between the collector of the amplifier transistor and the voltage supply source and is inductively coupled with the coil of the tunable selection circuit.

The coil coupled with the coil of the tunable selection circuit can be arranged together with the coil of the tunable selection circuit on a common carrier. Also, the coil coupled with the coil of the tunable selection circuit may have a relatively small number of windings.

The number of windings and the coupling degree of the coil coupled with the coil of the tunable selection circuit are preferably so selected that the component of the signal collector current of the amplifier transistor flowing through the coil coupled with the coil of the tunable selection circuit is as small as possible and the component of the collector current of the amplifier transistor flowing to the tunable selection circuit is as large as possible. Also, the coil coupled with the coil of the tunable selection circuit is preferably poled in such a way that the current flowing through it is a minimum.

The amplifier transistor is preferably operated in common base connection. The tunable selection circuit preferably comprises two variable capacitance diodes and arranged between these two variable capacitance diodes and the reference point is preferably a capacitor whose capacitance is so selected that the gain characteristic of the amplifier exhibits a pole (minimal amplification) in the range of the image frequency.

BRIEF DESCRIPTION OF THE DRAWING

The invention will now be described in greater detail, by way of examples, with reference to the drawing in which the FIGURE shows a direct-current transformer.

DESCRIPTION OF THE PREFERRED EMBODIMENTS

As is apparent from the FIGURE, the amplifier according to the invention comprises an amplifier transistor 1 which in the embodiment shown in the Figure is operated in common base connection. The base bias for transistor 1 is generated by a voltage divider which is comprised of resistors 2 and 3 and is arranged between the operating voltage source 16 and the reference point (ground). The input signal is fed to a tuning circuit comprising a twin tuning diode 4 and coil 5. Coupled (inductively) with this tuning circuit is a coil 6 which feeds the selected input signal to the emitter of the amplifier transistor 1. The resistor 7 fulfills bias voltage purposes and capacitor 8 bypasses resistor 7 for the signal frequency. Connected to the collector of transistor 1 is a capacitor 9 whose capacitance is preferably so selected that the capacitor practically constitutes a short circuit for the operating signals. The tunable selection circuit following capacitor 9 is comprised of the two variable capacitance diodes 10 and 11 and the coil 12. Instead of two variable capacitance diodes, it is preferable to use a twin diode or a single diode. In the given example, the output signal is fed via a capacitive voltage divider to the following stage, preferably a mixer stage. The voltage divider consists, for example, of capacitors 12 and 13. Inductively coupled with the coil 14 of the tunable selection circuit is a coil 15 which is connected, on the one hand, to the collector of amplifier transistor 1 and, on the other hand, to the operating voltage source 16. The coil 15 has two functions. On the one hand, it must connect the collector of transistor 1 to operating potential (source 16) and, on the other hand, it must bring about a high load resistance in order that at signal or operating frequency the component of the collector current of transistor 1 flowing through coil 15 is as low as possible and the component of the collector current of transistor 1 flowing via capacitor 9 to the tunable selection circuit is as high as possible. If the load resistor is in the form of a coil and this coil is to bring about a high load resistance, quite a lot of coil windings (inductance coil) are generally required. However, this is not the case if, in accordance with the invention, coil 15 is coupled with coil 14 of the tunable selection circuit, i.e., if coil 15 is inductively coupled, relatively few windings are required. By appropriate magnetic coupling (coupling degree) of coil 15 with coil 14 and appropriate polariy, a small current can be made to flow in coil 15, in spite of the relatively small number of windings in coil 15. Hence the main component of the collector current of transistor 1 does not flow through coil 15 but to the tunable selection circuit.

Regarding the polarity of coil 15, it should be taken into consideration that with a certain polarity, a smaller current flows through coil 15 than with the reverse polarity. This effect is strongest at operating frequency (resonance of the tuning circuit).

The size of the output resistance of transistor 1 is (co-) determined by the capacitances of capacitors 9 and 17. Capacitor 17 is arranged between the input of the tunable selection circuit and the reference point. The output resistance of the transistor at operating fequency can, for example, be determined by appropriate dimensioning of the capacitances of capacitors 9 and 17. Resistors 18 and 19 serve to supply the variable capacitance diodes 10 and 11 with direct current. Capacitors 12 and 13 determine the output resistance of the circuit shown in the Figure.

The capacitance of capacitor 20 located between the two variable capacitance diodes 10 and 11 and the reference point is set so that a gain characteristic pole (minimum) occurs in the range of the image frequency. The undesired image frequency signal known to occur in heterodyne receivers is thereby suppressed.

Capacitor 21 connects the base of transistor 1 for the operating frequency range to reference potential (common base connection). Capacitor 22 connects the antenna with the input resonant circuit 23.

What is claimed is:

1. An amplifier comprising:
   an amplifier transistor and a tunable selection circuit with a coil, wherein a signal from a collector of the amplifier transistor is fed to the selection circuit via a capacitor and wherein a further coil is arranged between the collector of the amplifier transistor and a supply voltage source and is inductively coupled with the coil of the tunable selection circuit, whereby said coupling of said coils controls the direction of a desired portion of said supply voltage to said transistor collector and the direction of a desired portion of said signal to said tuner coil.

2. An amplifier comprising:

an amplifier transistor and a tunable selection circuit with a coil, wherein a signal from a collector of the amplifier transistor is fed to the selection circuit via a capacitor and wherein a further coil is arranged between the collector of the amplifier transistor and a supply voltage source and is inductively coupled with the coil of the tunable selection circuit; and wherein the number of windings and the coupling degree of the coil coupled with the coil of the tunable selection circuit are so selected that the component of a signal collector current of the amplifier transistor flowing through the coil coupled with the coil of the tunable selection circuit is as small as possible and the component of the collector current of the amplifier transistor flowing to the tunable selection circuit is as large as possible.

3. An amplifier comprising:

an amplifier transistor and a tunable selection circuit with a coil, wherein a signal from a collector of the amplifier transistor is fed to the selection circuit via a capacitor and wherein a further coil is arranged between the collector of the amplifier transistor and a supply voltage source and is inductively coupled with the coil of the tunable selection circuit; and wherein the coil coupled with the coil of the tunable selection circuit is poled in such a way that a signal current which flows through it and to whose frequency an output circuit is tuned is a minimum.

4. An amplifier comprising:

an amplifier transistor and a tunable selection circuit with a coil, wherein a signal from a collector of the amplifier transistor is fed to the selection circuit via a capacitor and wherein a further coil is arranged between the collector of the amplifier transistor and a supply voltage source and is inductively coupled with the coil of the tunable selection circuit; and wherein the tunable selection circuit comprises two variable capacitance diodes or a corresponding variable capacitance twin diode and there is arranged between these two variable capacitance diodes and a reference point a capacitor whose capacitance is so selected that the gain characteristic of the amplifier exhibits a minimum in the range of an image frequency.

* * * * *